United States Patent [19]

Azuma et al.

[11] Patent Number: 4,530,746

[45] Date of Patent: Jul. 23, 1985

[54] PHOTOSENSITIVE RESIN COMPOSITION

[75] Inventors: Kazufumi Azuma, Hiratsuka; Kazuo Nate, Machida; Mitsuo Nakatani, Yokohama; Hitoshi Yokono, Fujisawa; Takeshi Endo, Yokohama, all of Japan

[73] Assignee: Hitachi, Ltd., Tokyo, Japan

[21] Appl. No.: 496,591

[22] Filed: May 20, 1983

[30] Foreign Application Priority Data

May 24, 1982 [JP] Japan .................................. 57-86606

[51] Int. Cl.³ .............................................. C08F 2/50
[52] U.S. Cl. .......................... 204/159.13; 204/159.15; 204/159.17; 204/159.19; 526/266; 526/270
[58] Field of Search ...................... 204/159.19, 159.13, 204/159.17, 159.15; 526/266, 270

[56] References Cited

U.S. PATENT DOCUMENTS

| 4,119,617 | 10/1978 | Hanyuda et al. | 526/266 |
| 4,141,806 | 2/1979 | Keggenhoff et al. | 204/159.23 |
| 4,332,731 | 6/1982 | Endo et al. | 526/270 |
| 4,358,354 | 11/1982 | Iida et al. | 204/159.16 |
| 4,396,476 | 8/1983 | Roemer et al. | 204/159.16 |

FOREIGN PATENT DOCUMENTS 15508  1/1983 Japan .
154575 9/1983 Japan .

OTHER PUBLICATIONS

Bailey, "Synthesis and Free Radical Ring-Opening Polymerization . . . ", Macromolecular Chem. 183, 1913-1920, (1982).

Cho, "Exploratory Ring-Opening Polymerization . . . " Journal of Polymer Science: Polymer Letters Ed., vol. 20, 361-364, (1982).

Bailey, "Free Radical Ring-Opening Polymerization . . . " Macromolecules, vol. 15, pp. 711-714, 1982.

*Primary Examiner*—John C. Bleutge
*Assistant Examiner*—A. H. Koeckert
*Attorney, Agent, or Firm*—Antonelli, Terry & Wands

[57] ABSTRACT

A photosensitive resin composition comprising (a) 10 to 90 parts by weight of at least one polymerizable monomer of the formula:

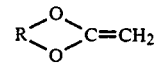

(R is defined in the specification), (b) 90 to 10 parts by weight of at least one compound selected from the group consisting of epoxy-acrylate resins, 1,2-polybutadiene resins, polyester resins and organopolysiloxanes, all having one or more acryloyloxy or methacryloyloxy groups in their molecular end or ends, and (c) 0.05 to 5 parts by weight of a photosensitizer based on 100 parts by weight of the sum of the components (a) and (b) shows slight shrinkage and the resulting coating film is good in adhesive properties and mechanical strength.

15 Claims, No Drawings

PHOTOSENSITIVE RESIN COMPOSITION

The present invention relates to a photosensitive resin composition comprising a monomer showing slight shrinkage upon polymerization.

As polymerizable monomers showing slight shrinkage upon polymerization, 2-methylene-1,4,6-trioxaspiro[4,6]undecane, 1-vinyl-4-alkyl-2,6,7-trioxabicyclo[2,2,2]octane and the like are known, for example. As processes for polymerizing these monomers, a cationic polymerization process and a thermal radical polymerization process are known.

When these monomers are used in electronic materials, (i) the cationic polymerization process is undesirable because an acid is used as catalyst and introduction of such ionic substances into the material cannot be prevented completely, and (ii) the thermal polymerization process is undesirable due to limited applicability because the high temperatures used in this process can cause deterioration of other parts. Further, a technique of radical-polymerization of these monomers by the use of a photosensitizer is impractical because of an extremely low sensitivity to light.

On the other hand, the hitherto well known photo-radical polymerizable monomers such as vinyl chloride, styrene, methyl methacrylate and the like show great volume shrinkage upon polymerization, as shown in Table 1.

TABLE 1

| Monomer | Degree of volume shrinkage upon polymerization (%) |
| --- | --- |
| Ethylene | 66.0 |
| Vinyl chloride | 34.4 |
| Acrylonitrile | 31.0 |
| Vinyl acetate | 20.9 |
| Styrene | 14.5 |
| Methyl methacrylate | 21.2 |
| Ethyl methacrylate | 17.8 |

If a monomer showing great volume shrinkage upon polymerization is used as a molding material, there arises a problem in that dimensional accuracy is insufficient. If such a monomer is used as a casting material, the material embedded therein undergoes a strain due to the shrinkage, and adhesion between the casting material and the mold drops or a gap appears between them. If such a monomer is used as an adhesive, the internal strain causes various practical troubles such as decrease in bonding strength, warpage, deformation, and so on.

An object of the present invention is to provide a photosensitive resin composition which forms a resin by photo-radical polymerization and shows a small degree of volume shrinkage at the time of polymerization.

The present invention provides a photosensitive resin composition which comprises:

(a) 10 to 90 parts by weight of at least one polymerizable monomer represented by the following formula:

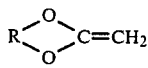
 (1)

wherein R represents

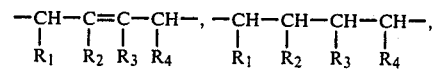

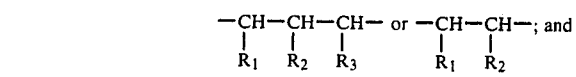

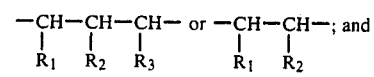

$R_1$, $R_2$, $R_3$ and $R_4$ independently represent hydrogen, an alkyl group having 1–5 carbon atoms, a phenyl group or a substituted phenyl group, (b) 90 to 10 parts by weight of at least one compound selected from the group consisting of epoxy-acrylate resins, 1,2-polybutadiene resins, polyester resins and organopolysiloxanes, all having one or more acryloyloxy groups or methacryloyloxy groups on their molecular end or ends, and (c) 0.05 to 5 parts by weight of a photosensitizer based on 100 parts by weight of the sum of the components (a) and (b).

The present inventors synthesized various monomers expected to have photo-radical polymerizability and to show a small degree of shrinkage at the time of polymerization. As a result, it was found that polymerizable monomers represented by the following general formula (1):

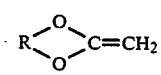
 (1)

wherein R represents

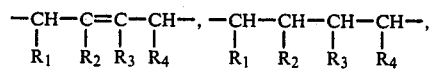

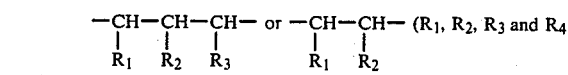

independently represent hydrogen, an alkyl group having 1–5 carbon atoms, a phenyl group or a substituted phenyl group, are effective for this purpose.

In the above formula (1), the substituted phenyl group in the definition of $R_1$ to $R_4$ includes a phenyl group substituted with a lower alkyl group such as

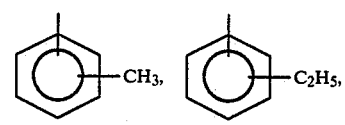

etc.; a phenyl group substituted with a lower alkoxy group such as

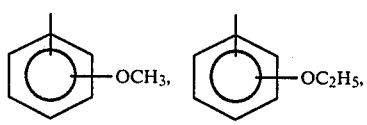

etc.; a phenyl group substituted with a halogen atom such as

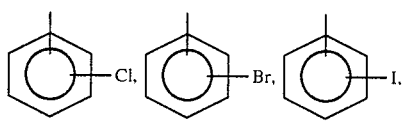

etc.; or other substituted phenyl groups such as

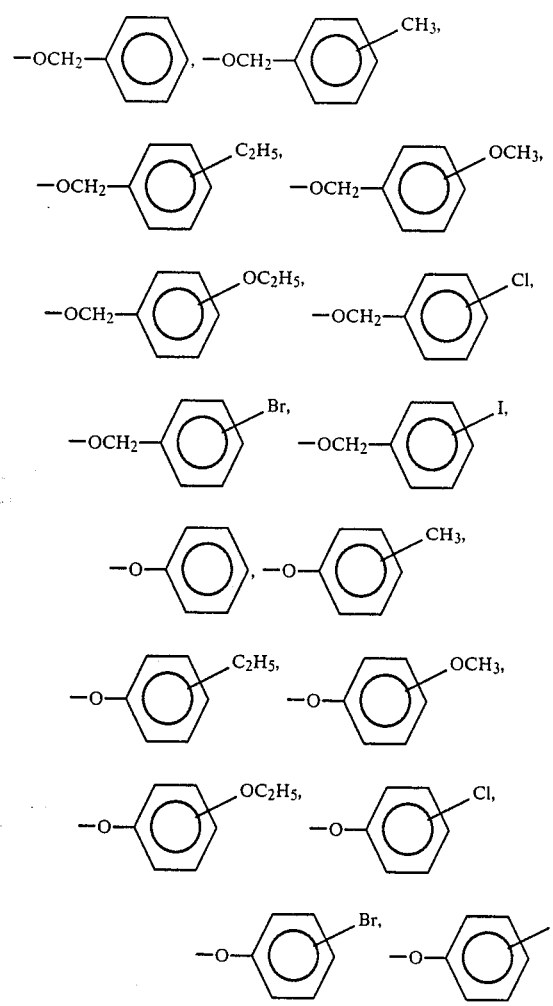

etc.

Examples of the compound of the formula (1) are
2-methylene-1,3-dioxolane,
2-methylene-1,3-dioxane,
2-methylene-1,3-dioxepane,
2-methylene-4-phenyl-1,3-dioxolane,
2-methylene-4-phenyl-1,3-dioxane,
2-methylene-4-phenyl-1,3-dioxepane,
2-methylene-4-phenoxy-1,3-dioxolane,
2-methylene-4-phenoxy-1,3-dioxane,
2-methylene-4-phenoxy-1,3-dioxepane,
2-methylene-5-phenyl-1,3-dioxane,
2-methylene-5-phenyl-1,3-dioxepane,
2-methylene-5-phenoxy-1,3-dioxane, and
2-methylene-5-phenoxy-1,3-dioxepane.

Next, the invention will be explained in more detail by referring to 2-methylene-1,3-dioxepane (hereinafter, referred to as "compound (2)") which is a compound represented by the formula:

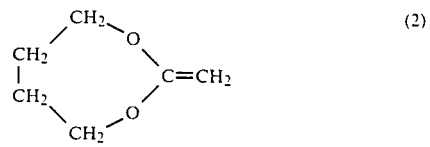

Compound (2) can be synthesized, for example, by the following process. Equimolar quantities of cis-2-butene-1,4-diol and haloacetaldehyde dialkyl acetal are heated at about 120° C. in the presence of an acidic catalyst such as p-toluenesulfonic acid or the like to bring about an alcohol-eliminating reaction represented by the equation (3) and to form a compound of the formula (4) as follows:

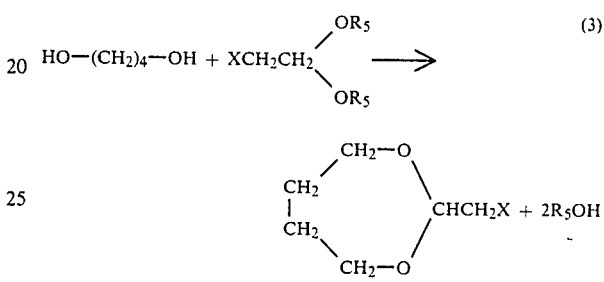

wherein X is a halogen atom such as Cl, Br, I or the like; and $R_5$ is an alkyl group such as $CH_3$, $C_2H_5$ or the like.

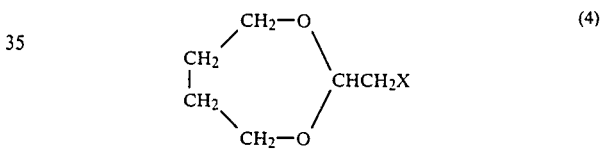

wherein X is a halogen atom such as Cl, Br, I or the like.

The compound of the formula (4) can be isolated by distillation under reduced pressure.

The progress of the above-mentioned alcohol-eliminating reaction (3) can easily be detected by analyzing the reaction mixture by means of liquid chromatography or by determining the quantity of alcohol formed.

Then, the compound of the formula (4) is dehydrohalogenated by a conventional procedure in the presence of an alkali, by which the compound (2) can be obtained. Progress of this reaction can easily be detected by analyzing the reaction mixture by means of liquid chromatography.

The component (a), i.e. at least one polymerizable monomer selected from the compounds represented by the formula (1), is used in an amount of 10–90 parts by weight, preferably 15–40 parts by weight. If the amount of the component (a) is smaller than 10 parts by weight, the composition generally becomes highly viscous and poor in workability. If its amount is greater than 90 parts by weight, strength of cured resin becomes generally insufficient.

As the component (b), at least one compound selected from epoxy-acrylate resins, 1,2-polybutadiene resins, polyester resins and organopolysiloxanes, all having one or more acryloyloxy groups or methacryloyloxy groups on their molecular end or ends, is used. Preferably, these compounds have a molecular weight of 400–10,000. If the molecular weight is lower than 400, a cured resin tends to lower its mechanical characteristics. If the molecular weight is higher than 10,000, there is a tendency that viscosity of the liquid photosensitive resin composition is too high to keep sufficient workability. Therefore, these cases outside the above-mentioned molecular weight range cannot be used practically. These resins may be used either alone or as a mixture thereof. The component (b) is used in an amount of 90–10 parts by weight, preferably 85–60 parts by weight. When the amount of the component (b) is too much, workability becomes worse due to high viscosity, while when the amount of the component (b) is too small, photocurability becomes worse and mechanical properties of cured products are undesirably lowered.

Photosensitizers usable as the component (c) include benzoin and its derivatives; benzoin alkyl ethers such as benzoin methyl ether, benzoin ethyl ether, benzoin isopropyl ether and the like; benzil and its derivatives; anthraquinones such as anthraquinone, 2-methylanthraquinone and the like; acetophenone and its derivatives; benzophenone and its derivatives; diacetyl dithiocarbamate; α-chloromethylnaphthalene; anthracene; diphenyl disulfide; aryl diazonium salts; and the like. These photosensitizers may be used either alone or in the form of a mixture thereof. The component (c) is used in an amount of 0.05–5 parts by weight per 100 parts by weight of the sum of the components (a) and (b). If the amount of the component (c) is smaller than 0.05 part by weight, curing speed is low. On the other hand, when it is larger than 5 parts by weight, a resin of high molecular weight cannot be formed, so that mechanical characteristics of the resin are very low. Therefore, it is undesirable to use the component (c) in such amounts.

Optionally, one or more addition-polymerizable monomers having at least one

group in the molecule and having a boiling point of 100° C. or higher at ordinary pressure, fillers, thixotropic agents, colorants, thermal polymerization initiators, adhesion-improvers, antioxidants, surface cure accelerators and the like may be incorporated into the photosensitive resin composition of the present invention.

As said addition-polymerizable monomers, those having at least one

group and having a boiling point of 100° C. or higher at ordinary pressure are preferable. Addition-polymerizable monomers of which boiling point is lower than 100° C. are undesirable, because the viscosity of resin can rise during the processing and such monomers can be greatly lost at the time of photo-cure. Furthermore, such monomers are undesirable from the viewpoint of safety. Examples of preferable addition-polymerizable monomers include styrene; styrene derivatives such as vinyltoluene and the like; acrylic acid; acrylic acid derivatives such as butyl acrylate and the like; methacrylic acid; methacrylic acid derivatives such as ethyl methacrylate, lauryl methacrylate and the like; polyfunctional acrylic ester compounds and polyfunctional methacrylic ester compounds having two or more unsaturated groups such as 1,6-hexandiol diacrylate, ethylene glycol dimethacrylate, trimethylolpropane trimethacrylate and the like; polyfunctional vinyl monomers such as divinylbenzene, diallyl phthalate and the like; oligoester type monomers having acryloyloxy group or methacryloyloxy group such as Arrownix 6300 (manufactured by Toagosei Chemical Industry Co., Ltd.) and the like; and so on. These monomers may be used either alone or as a mixture thereof.

As said fillers, aluminum oxide, silicon dioxide, calcium carbonate, titanium dioxide, powdered mica and the like are usable. As said thixotropic agents, finely powdered silicon dioxide having a specific surface area of 100–450 m²/g, and the like are preferable.

As said colorants, conventional pigments and dyes such as Phthalocyanine Green, Phthalocyanine Blue and the like are usable.

As said thermal polymerization initiators, radical polymerization initiators such as benzoyl peroxide, 2,2'-azobisisobutyronitrile, di-tert-butyl peroxide and the like are usable.

As said adhesion-improvers, silane couplers such as γ-methacryloxypropyltrimethoxysilane, vinyltris(β-methoxyethoxy)silane, γ-aminopropyltrimethoxysilane and the like are preferable.

As said antioxidants, thermal polymerization inhibitors such as hydroquinone, hydroquinone methyl ether, catechol, 2,6-di-tert-butyl-4-methylphenol and the like are effectively usable.

As said surface-cure accelerators, metallic salts of organic acids such as cobalt naphthenate, manganese octanoate and the like are preferable.

As the light source for curing the material of the present invention, a high-pressure mercury lamp, an ultra-high pressure mercury lamp, a metal halide lamp, a carbon arc lamp, a xenone lamp and the like are usable. Optionally, electron beams, X-rays, microwaves and the like may also be used for carrying out the polymerization.

The above-mentioned photosensitive resin composition of the present invention exhibits excellent adhesion to various metals and glass after cure and shows a small degree of shrinkage at the time of cure. Accordingly, it is quite conveniently usable as adhesive, coating material or varnish and paint. Further, it is usable also for casting and molding, as well as for the production of composite materials.

Next, a process for synthesizing the compounds used in the present invention will be described.

SYNTHESIS EXAMPLE 1

In a 300-ml flask were placed 24.6 g (0.22 mole) of t-butoxy potassium and 50 ml of t-butyl alcohol, into which was dropped 32.7 g (0.22 mole) of 2-chloromethyl-5,6-dihydro-1,3-dioxepane. After refluxing the mixture at 90° C. for 10 hours, water was added and the product was extracted with ether. Progress of the reaction was checked by sampling a small portion of the reaction mixture, extracting it with ether and analyzing its components by gas chromatography. When the chromatographic peaks of starting compounds had completely disappeared, the reaction was stopped.

The reaction mixture was twice washed with water, the ether layer was dried over anhydrous sodium sulfate, the solvent was distilled off, and then the residue was distilled under reduced pressure to obtain 14 g of 2-methylene-5,6-dihydro-1,3-dioxepane. Its yield was 55%, and its characteristic properties were as follows:

[Elementary analyses (%)] Found—C: 64.2; H: 7.2. Calculated for $C_6H_8O_2$—C: 64.3; H: 7.1.

[Boiling point] 45° C./4 mmHg.

[Infrared absorption spectrum] 2950, 1660, 1280, 1040 $cm^{-1}$.

[NMR spectrum] (.H NMR, 60 MHz, $CDCl_3$) δ (ppm): 3.50

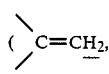

S, 2), 3.95–4.75 (2-O—C$\underline{H}_2$—, m, 4), 6.30–6.70 (C$\underline{H}$=C$\underline{H}$, m, 2).

The 2-chloromethyl-5,6-dihydro-1,3-dioxepane used above had been synthesized by the following process. That is, 88 g (1.0 mole) of cis-2-butene-1,4-diol and 124.5 g (1.0 mole) of chloroacetaldehyde dimethyl acetal were placed in a 300-ml flask, to which was added 0.5 g of Dowex 50 (H+) resin as a catalyst. The mixture was stirred at 115° C., while distilling the resulting methanol out of the system. When the amount of methanol formed had reached 63 g, the reaction was stopped. After removing the catalyst by filtration, the filtrate was distilled under reduced pressure to obtain 84 g of 2-chloromethyl-5,6-dihydro-1,3-dioxepane. Its yield was 57%, and its characteristic properties were as follows:

[Elementary analyses (%)] Found—C: 48.7; H: 6.0. Calculated for $C_6H_9O_2Cl$—C: 48.5; H: 6.1.

[Boiling point] 61°–2° C./4 mmHg.

[NMR spectrum] (.H NMR, 60 MHz, $CDCl_3$) δ (ppm): 3.40–3.70 (C$\underline{H}_2$Cl, d, 2), 3.90–4.75 (2-O—C$\underline{H}_2$, m, 4), 4.85–5.10

t, 2), 5.70 (C$\underline{H}$=C$\underline{H}$, m, 2).

SYNTHESIS EXAMPLE 2

A mixture consisting of 0.22 mole of t-BuOK and 40 ml of t-BuOH was heated to 80° C., into which was dropped 0.22 mole of 2-chloromethyl-1,3-dioxepane. After heating the mixture to 100° C. and stirring it continuously for about 8 hours, it was extracted with ether. After removing the solvent, the residue was distilled under reduced pressure to obtain 18 g of 2-methylene-1,3-dioxepane [yield 72%; boiling point 43° C./5 mm Hg].

The 2-chloromethyl-1,3-dioxepane used had been synthesized by the following procedure. That is, 0.4 mole of chloroacetaldehyde dimethyl acetal was mixed with 0.4 mole of 1,4-butanediol, to which was added 0.5 g of Dowex 50 resin (H+ form) as a catalyst. Then, the mixture was stirred at 115° C., while distilling the resulting methanol out of the system. When 0.8 mole of methanol had been distilled out, the reaction was stopped, the resin was filtered off, and the filtrate was distilled under reduced pressure to obtain 41 g of 2-chloromethyl-1,3-dioxepane [yield 68%; boiling point 80° C./14 mm Hg]

SYNTHESIS EXAMPLE 3

A mixture consisting of 0.3 mole of t-BuOK and 42 ml of t-BuOH was heated to 80° C., into which was dropped 0.3 mole of 2-chloromethyl-1,3-dioxane. After dropping it, the temperature of the resulting mixture was elevated to 115° C., and it was refluxed for about 5 hours. Extraction with ether followed by distillation under reduced pressure gave 18 g of 2-methylene-1,3-dioxane [yield 60%; boiling point 63° C./60 mm Hg].

The 2-chloromethyl-1,3-dioxane used above had been synthesized by the following procedure. That is, a mixture consisting of 0.2 mole of chloroacetaldehyde dimethyl acetal and 0.2 mole of 1,3-propanediol was mixed with 0.5 g of Dowex 50 resin (H+ form) as a catalyst and then stirred at 120° C. while distilling the resulting methanol out of the system. When 0.4 mole of methanol had been distilled out, the reaction was stopped (about 6 hours after the start of the reaction), the resin was filtered off, and the filtrate was distilled under reduced pressure to obtain 26 g of 2-chloromethyl-1,3-dioxane [yield 95%; boiling point 65° C./5 mm Hg].

SYNTHESIS EXAMPLE 4

A mixture consisting of 0.3 mole of t-BuOK and 42 ml of t-BuOH was heated to 80° C., into which was dropped 0.3 mole of 2-chloromethyl-1,3-dioxolane. Subsequently, the product was purified by the same method as in Synthesis Example 3 to obtain 16.8 g of 2-methylene-1,3-dioxolane [yield 65%; boiling point 40° C./10 mm Hg].

The 2-chloromethyl-1,3-dioxolane used above had been synthesized by adding Dowex 50 (H+ form) as an acid catalyst to a mixture of ethylene glycol and chloroacetaldehyde dimethyl acetal and carrying out the methanol-eliminating reaction.

EXAMPLE 1

A mixture consisting of 80 parts by weight of epoxy-diacrylate resin having a molecular weight of about 500 and having acryloyloxy groups on both the terminals of molecule, 20 parts by weight of 2-methylene-1,3-dioxepane and 2 parts by weight of benzoin isopropyl ether was coated on a glass substrate so as to give a thickness of about 50 μm and irradiated for 30 seconds with a 120 W/cm metal halide lamp (220 mW/cm² at 365 nm) to obtain a cured coating film. Measurement of adhesive properties of the cured coating film to the glass substrate revealed that the tensile adhesive strength was higher than 10 MPa both in ordinary state and after absorption of water (after being boiled in water for one hour), demonstrating the excellency of adhesive properties.

EXAMPLE 2

A mixture consisting of 70 parts by weight of epoxy-diacrylate resin having a molecular weight of about 500 and having acryloyloxy groups on both the molecular terminals, 30 parts by weight of 2-methylene-1,3-dioxepane and 2 parts by weight of benzoin isopropyl ether was coated on a glass substrate so as to give a thickness of about 50 μm and irradiated for 30 seconds with a 120 W/cm metal halide lamp (220 mW/cm$^2$ at 365 nm) to obtain a cured coating film. Measurement of adhesive properties of the cured coating film to the glass substrate revealed that tensile adhesive strength was higher than 10 MPa both in ordinary state and after absorption of water (after being boiled in water for one hour), demonstrating its excellency in adhesive properties.

EXAMPLE 3

A thoroughly blended and kneaded mixture consisting of 60 parts by weight of 1,2-polybutadiene dimethacrylate resin having a molecular weight of about 2,600 and having methacryloyloxy groups on both the molecular terminals, 40 parts by weight of 2-methylene-1,3-dioxane, 3 parts by weight of 2-methylanthraquinone and 100 parts by weight of α-alumina powder having a particle size of 1 μm was coated on an α-alumina substrate so as to give a thickness of about 50 μm and irradiated for 1 minute with a 120 W/cm metal halide lamp to obtain a cured coating film, in the same manner as in Example 1. Measurement of adhesive properties of the cured coating film to the α-alumina substrate revealed that the tensile adhesive strength was higher than 10 MPa both in ordinary state and after boiling the sample in water for one hour. Thus, there was obtained a photosensitive resin composition exhibiting excellent adhesive properties.

EXAMPLE 4

A thoroughly blended and kneaded mixture consisting of 70 parts by weight of organopolysiloxane having a molecular weight of about 5,000 and having a methacryloyloxy group on a molecular terminal, 30 parts by weight of 2-methylene-1,3-dioxolane, 2 parts by weight of 4-methoxybenzophenone, 10 parts by weight of finely powdered silicon dioxide having a specific surface area of 380 m$^2$/g and 10 parts by weight of ethylene glycol dimethacrylate was coated on an aluminum substrate so as to give a thickness of about 50 μm and irradiated for one minute with a 120 W/cm metal halide lamp to obtain a cured coating film, in the same manner as in Example 1. Measurement of adhesive properties of the cured coating film to the aluminum substrate revealed that the tensile adhesive strength was higher than 10 MPa both in ordinary state and after boiling the sample in water for one hour, demonstrating its excellency in adhesive properties.

EXAMPLES 5 TO 11

In the same manner as in Examples 1 to 3, various photosensitive resin compositions shown in Table 2 were prepared, coated on glass substrates so as to give a thickness of about 50 μm and irradiated for one minute with a 120 W/cm metal halide lamp to obtain cured coating films. Adhesive properties of the cured coating films to the glass substrates were measured. As shown in Table 2, all the coating films had tensile adhesive strength higher than 10 MPa, demonstrating their excellency in adhesive properties.

COMPARATIVE EXAMPLES 1 AND 2

In the same manner as in the preceding examples, the resin compositions shown in the lower part of Table 2 were prepared. They were coated on glass substrates so as to give a thickness of about 50 μm and irradiated for one minute with a 120 W/cm metal halide lamp to obtain cured coating films, after which their adhesive properties to the glass substrates were measured. As shown in Table 2, they exhibited low adhesion after absorption of water, demonstrating their inferiority in adhesive power.

TABLE 2

| Example No. | Polymerizable monomer | | Resin | |
|---|---|---|---|---|
| Example 5 | 2-Methyl-1,3-dioxepane | 90 parts by wt. | Epoxy-diacrylate resin (MW ca. 500) | 10 parts by wt. |
| Example 6 | 2-Methyl-1,3-dioxepane | 70 parts by wt. | Epoxy-diacrylate resin (MW ca. 500) | 30 parts by wt. |
| Example 7 | 2-Methyl-1,3-dioxepane | 50 parts by wt. | Epoxy-diacrylate resin (MW ca. 500) | 50 parts by wt. |
| Example 8 | 2-Methyl-1,3-dioxepane | 10 parts by wt. | Epoxy-diacrylate resin (MW ca. 500) | 90 parts by wt. |
| Example 9 | 2-Methyl-1,3-dioxepane | 80 parts by wt. | 1,2-Polybutadiene dimethacrylate (MW ca. 2,600) | 20 parts by wt. |
| Example 10 | 2-Methyl-1,3-dioxepane | 30 parts by wt. | 1,2-Polybutadiene dimethacrylate (MW ca. 2,600) | 70 parts by wt. |
| Example 11 | 2-Methyl-1,3-dioxepane | 20 parts by wt. | 1,2-Polybutadiene dimethacrylate (MW ca. 2,600) | 80 parts by wt. |
| Comparative Example 1 | 2-Methyl-1,3-dioxepane | 0 parts by wt. | Epoxy-diacrylate resin (MW ca. 500) | 70 parts by wt. |
| Comparative Example 2 | 2-Methyl-1,3-dioxepane | 0 parts by wt. | Epoxy-diacrylate resin (MW ca. 500) | 60 parts by wt. |

| Example No. | Photosensitizer | | Other additives | | Tensile adhesive strength* |
|---|---|---|---|---|---|
| Example 5 | Benzophenone | 3 parts by wt. | α-Alumina powder (particle size 1 μm) | 200 parts by wt. | >10 MPa |
| Example 6 | 2-Methylanthraquinone | 2 parts by wt. | γ-Aminopropyltrimethoxysilane | 3 parts by wt. | >10 |
| Example 7 | 2-Methylanthraquinone | 2 parts by wt. | Phthalocyanine Green | 0.1 parts by wt. | >10 |
| Example 8 | 2-Methylanthraquinone | 2 parts by wt. | 1,6-Hexandiol diacrylate | 5 parts by wt. | >10 |
| Example 9 | Benzoin isopropyl ether | 3 parts by wt. | Silica powder (particle size 1 μm) | 100 parts by wt. | >10 |
| Example 10 | Benzophenone | 2 parts by wt. | 2-Hydroxyethyl methacrylate | 10 parts by wt. | >10 |

TABLE 2-continued

| Example 11 | 2-Methylanthraquinone | 1 parts by wt. | Alumina powder<br>γ-Aminopropyltri-methoxysilane | 50 parts by wt<br>3 parts by wt. | >10 |
|---|---|---|---|---|---|
| Comparative Example 1 | 2-Methylanthraquinone | 2 parts by wt. | 1,6-Hexandiol diacrylate | 30 parts by wt. | 2 |
| Comparative Example 2 | Benzoin isopropyl ether | 2 parts by wt. | Ethylene glycol diacrylate<br>α-Alumina powder | 40 parts by wt.<br>100 parts by wt. | 3 |

*After boiling the sample in water for one hour

What is claimed is:

1. A photosensitive resin composition comprising:
   (a) 10 to 90 parts by weight of at least one polymerizable monomer represented by the formula:

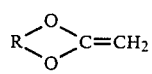  (1)

wherein R represents

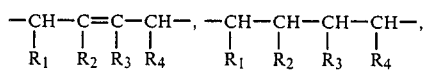

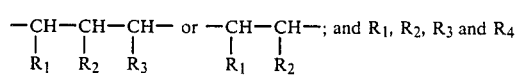; and $R_1$, $R_2$, $R_3$ and $R_4$ independently represent hydrogen, an alkyl group having 1-5 carbon atoms, a phenyl group or a substituted phenyl group,
   (b) 90 to 10 parts by weight of at least one compound selected from the group consisting of epoxy-acrylate resins, 1,2-polybutadiene resins, polyester resins and organopolysiloxanes, all having one or more acryloyloxy groups or methacryloyoxy groups on their molecular end or ends; and
   (c) 0.05 to 5 parts by weight of a photosensitizer based on 100 parts by weight of the sum of the components (a) and (b).

2. A photosensitive resin composition according to claim 1, wherein the polymerizable monomer represented by the formula (1) is 2-methylene-1,3-dioxolane, 2-methylene-1,3-dioxane, 2-methylene-1,3-dioxepane, 2-methylene-4-phenyl-1,3-dioxolane, 2-methylene-4-phenyl-1,3-dioxane, 2-methylene-4-phenyl-1,3-dioxepane, 2-methylene-4-phenoxy-1,3-dioxolane, 2-methylene-4-phenoxy-1,3-dioxane, 2-methylene-4-phenoxy-1,3-dioxepane, 2-methylene-5-phenyl-1,3-dioxane, 2-methylene-5-phenyl-1,3-dioxepane, 2-methylene-5-phenoxy-1,3-dioxane or 2-methylene-5-phenoxy-1,3-dioxepane.

3. A photosensitive resin composition according to claim 1, wherein said polymerizable monomer represented by formula (1) is 2-methylene-1,3-dioxepane, 2-methylene-1,3-dioxane, or 2-methylene-1,3-dioxolane.

4. A photosensitive resin composition comprising:
   (a) 15 to 40 parts by weight of at least one polymerizable monomer represented by the following formula:

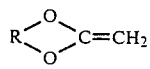  (1)

wherein R represents

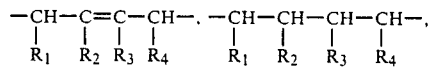

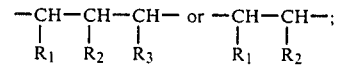

and $R_1$, $R_2$, $R_3$ and $R_4$ independently represent hydrogen, an alkyl group having 1-5 carbon atoms, a phenyl group or a substituted phenyl group,
   (b) 85 to 60 parts by weight of at least one compound selected from the group consisting of epoxy-acrylate resins, 1,2-polybutadiene resins, polyester resins and organopolysiloxanes, all having one or more acryloyloxy groups or methacryloyloxy groups on their molecular end or ends; and
   (c) 0.05 to 5 parts by weight of a photosensitizer based on 100 parts by weight of the sum of the components (a) and (b).

5. A photosensitive resin composition according to claim 4, wherein the polymerizable monomer represented by the formula (1) is 2-methylene-1,3-dioxolane, 2-methylene-1,3-dioxane, 2-methylene-1,3-dioxepane, 2-methylene-4-phenyl-1,3-dioxolane, 2-methylene-4-phenyl-1,3-dioxane, 2-methylene-4-phenyl-1,3-dioxepane, 2-methylene-4-phenoxy-1,3-dioxolane, 2-methylene-4-phenoxy-1,3-dioxane, 2-methylene-4-phenoxy-1,3-dioxepane, 2-methylene-5-phenyl-1,3-dioxane, 2-methylene-5-phenyl-1,3-dioxepane, 2-methylene-5-phenoxy-1,3-dioxane or 2-methylene-5-phenoxy-1,3-dioxepane.

6. A photosensitive resin composition according to claim 4, wherein said polymerizable monomer represented by the formula (1) is 2-methylene-1,3-dioxepane, 2-methylene-1,3-dioxane, or 2-methylene-1,3-dioxolane.

7. A photosensitive resin composition according to claim 1, wherein the compound of the component (b) has a molecular weight of 400 to 10,000.

8. A photosensitive resin composition according to claim 1, wherein the polymerizable monomer (a) is 2-methylene-1,3-dioxepane and the compound (b) is an epoxy-acrylate resin having at least one acryloyloxy group or methacryloyloxy group on a molecular end thereof.

9. A photosensitive resin composition according to claim 1, wherein compound (b) has a molecular weight of 400 to 10,000.

10. A photosensitive resin composition according to claim 1, wherein compound (b) has a molecular weight of 400 to 10,000.

11. A photosensitive resin composition according to claim 4, wherein compound (b) has a molecular weight of 400 to 10,000.

12. A photosensitive resin composition consisting essentially of:

(a) 15 to 40 parts by weight of at least one polymerizable monomer selected from the group consisting of 2-methylene-1,3-dioxolane, 2-methylene-1,3-dioxane, 2-methylene-1,3-dioxepane, 2-methylene-4-phenyl-1,3-dioxolane, 2-methylene-4-phenyl-1,3-dioxane, 2-methylene-4-phenyl-1,3-dioxepane, 2-methylene-4-phenoxy-1,3-dioxolane, 2-methylene-4-phenoxy-1,3-dioxane, 2-methylne-4-phenoxy-1,3-dioxepane, 2-methylene-5-phenyl-1,3-dioxane, 2-methylene-5-phenyl-1,3-dioxepane, 2-methylene-5-phenoxy-1,3-dioxane and 2-methylene-5-phenoxy-1,3-dioxepane;

(b) 85 to 60 parts by weight of at least one compound selected from the group consisting of epoxy-acrylate resins, 1,2-polybutadienes, polyester resins and organopolysiloxanes, all having one or more acryloyloxy groups or methacryloyloxy groups on their molecular end or ends and a molecular weight of 400 to 10,000; and (c) 0.05 to 5 parts by weight of a photosensitizer based on 100 parts by weight of the sum of the components (a) and (b).

13. A photosensitive resin composition according to claim 12, wherein the polymerizable monomer (a) is 2-methylene-1,3-dioxephane and the compound (b) is an epoxy-acrylate resin.

14. A photosensitive resin composition according to claim 1, wherein the substituted phenyl group is substituted with at least one substituent selected from the group consisting of a lower alkyl group, a lower alkoxy group, a halogen atom and an oxygen atom.

15. A photosensitive resin composition according to claim 1, wherein the photosensitizer is benozoin, a benzoin alkyl ether, a benzil, anthraquinone, an acetophenone, a benzophenone, diacetyl dithiocarbamate, α-chloromethyl naphthalene, anthracene, diphenyldisulfide and an aryl diazonium salt or a mixture thereof.

* * * * *